US008698993B2

(12) United States Patent
Lee (10) Patent No.: US 8,698,993 B2
(45) Date of Patent: Apr. 15, 2014

(54) FLAT DISPLAY PANEL, MOTHER SUBSTRATE FOR FLAT DISPLAY PANEL, AND METHOD OF MANUFACTURING THE FLAT DISPLAY PANEL (75) Inventor: Kyung-Jun Lee, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 140 days.

(21) Appl. No.: 13/200,391

(22) Filed: Sep. 23, 2011

(65) Prior Publication Data
US 2012/0099061 A1 Apr. 26, 2012

(30) Foreign Application Priority Data
Oct. 22, 2010 (KR) .................. 10-2010-0103673

(51) Int. Cl.
G02F 1/1339 (2006.01)
G02F 1/1333 (2006.01)

(52) U.S. Cl.
USPC .............. 349/153; 349/190; 349/58; 349/110

(58) Field of Classification Search
CPC ............ G02F 1/133308; G02F 1/133608; G02F 1/13452; G02F 1/133512; G02F 1/136209; G02F 2001/133388; G02F 1/0339; G02F 1/1341
USPC .................... 349/153, 110, 190, 58
See application file for complete search history.

(56) References Cited

U.S. PATENT DOCUMENTS

| 6,998,776 | B2* | 2/2006 | Aitken et al. .................. 313/512 |
| 7,339,647 | B2* | 3/2008 | Youn et al. .................... 349/153 |
| 7,371,143 | B2* | 5/2008 | Becken et al. .................. 445/25 |
| 7,659,663 | B2  | 2/2010 | Kwak .......................... 313/506 |
| 7,942,716 | B2* | 5/2011 | Lee et al. ......................... 445/24 |
| 7,948,175 | B2* | 5/2011 | Kurihara ....................... 313/512 |
| 2005/0219454 | A1 | 10/2005 | Lee |
| 2010/0109516 | A1 | 5/2010 | Warashina et al. |
| 2011/0210348 | A1* | 9/2011 | Yuasa ............................. 257/88 |

FOREIGN PATENT DOCUMENTS

| JP | 2008-251242 | 10/2008 |
| JP | 2009-054703 | 3/2009 |
| KR | 10-2001-0084380 A | 9/2001 |
| KR | 10-2005-0097727 | 10/2005 |
| KR | 10-2007-0071185 A | 7/2007 |
| KR | 10-2007-0078300 A | 7/2007 |
| KR | 10-2009-0094679 A | 9/2009 |
| KR | 10-2009-0098187 | 9/2009 |

* cited by examiner

Primary Examiner — Mike Qi
(74) Attorney, Agent, or Firm — Lee & Morse, P.C.

(57) ABSTRACT

A flat display panel includes a first substrate and a second substrate, and the first and second substrates are sealed via a sealing member therebetween. The second substrate includes a display region and a non-display region. The display region and the non-display region include black matrix patterns, and the black matrix patterns have at least one opening in a sealing region of the second substrate. The sealing member is arranged in the sealing region.

20 Claims, 8 Drawing Sheets

FLAT DISPLAY PANEL, MOTHER SUBSTRATE FOR FLAT DISPLAY PANEL, AND METHOD OF MANUFACTURING THE FLAT DISPLAY PANEL

BACKGROUND

1. Field

Embodiments relate to a flat display panel, a mother substrate for a flat display panel, and a method of manufacturing the flat display panel.

2. Description of the Related Art

Recently, conventional display devices tend to be replaced with portable and thin flat panel display device. Flat panel display devices may be embodied in various forms, such as liquid crystal display (LCD) devices, organic electroluminescent display devices, plasma display panels (PDP), or the like. A flat display panel included in a flat panel display device includes, e.g., a liquid crystal layer or organic light emitting diodes interposed between a first substrate and a second substrate. A pixel circuit may be formed on the first substrate.

If moisture or oxygen in a surrounding environment permeates into such a flat display panel, lifespan of devices may be reduced due to, e.g., oxidization and a peeling-off of electrode materials. Furthermore, light emitting efficiency may be deteriorated and colors of emitted lights may be spoiled due to, e.g., spoils of liquid crystals and organic materials. A sealing process may be performed during fabrication of a flat display panel, e.g., to isolate the interior of the flat display panel and to block permeation of moisture.

SUMMARY

Embodiments are directed to a simplification of a process for hardening a sealing member, which may be formed in a flat display panel.

Embodiments are also directed to hardening a sealing member by using a black matrix pattern as a mask while a laser is irradiated onto the sealing member during a sealing process.

Embodiments may be realized by providing a flat display panel that includes a first substrate and a second substrate, and the first and second substrates are sealed via a sealing member therebetween. Wherein the second substrate includes a display region and a non-display region, and the display region and the non-display region include black matrix patterns. The black matrix patterns have at least one opening in a sealing region of the non-display region, and the sealing member is arranged in the sealing region. Embodiments may also be realized by providing a mother substrate including a plurality of the flat display panels.

The sealing member may be arranged in the non-display region and may surround the display region. At least one black matrix pattern in the non-display region may include a plurality of linear black matrix patterns in the sealing region. The plurality of linear black matrix patterns may have a linear shape along the sealing member and may be arranged parallel to each other. Widths of the plurality of liner black matrix patterns may increase for corresponding linear black matrix patterns located closer to a center of the sealing region.

The sealing member may be arranged in the non-display region and may surround the display region. The black matrix pattern in the non-display region may include a plurality of crossing black matrix patterns that cross the sealing region and that may be successively arranged in the sealing region. Black matrix patterns in the display region and black matrix regions in the non-display region may include different materials and compositions. Black matrix patterns in the display region and black matrix regions in the non-display region may be successively arranged and may include a same material. Black matrix patterns in the non-display region may protect a laser beam from being irradiated toward regions outside the sealing region when the laser beam is irradiated toward the sealing member. At least one black matrix pattern in the display region may have a lattice shape including a plurality of openings corresponding to sub-pixels. The second substrate may include color filters formed in the plurality of openings. The sealing member may be a frit. The first substrate may include a pixel circuit and an organic light emitting diode (OLED). The first substrate may include a pixel circuit, and a liquid crystal layer may be interposed between the first substrate and the second substrate.

Embodiments may also be realized by providing a method of fabricating a flat display panel that includes a first substrate and a second substrate. The method includes forming black matrix patterns in a display region and a non-display region of the second substrate, and the black matrix patterns have at least one opening in a sealing region of the non-display region. The method includes arranging the second substrate in parallel to the first substrate, such that a sealing member is located in the sealing region of the second substrate and between the first and second substrates. The sealing member is configured to seal the first substrate and the second substrate. The method includes sealing the first substrate and the second substrate by irradiating a laser beam to the sealing member through the at least one opening in the black matrix patterns in the sealing region of the non-display region.

The sealing member may be located in the non-display region and may surround the display region. The forming of the black matrix patterns may include forming a plurality of linear black matrix patterns in the sealing region, and the plurality of linear black matrix patterns may have a linear shape along the sealing member. The plurality of linear black matrix patterns may be formed such that widths of the plurality of linear black matrix patterns increase for corresponding linear black matrix patterns located closer to a center of the sealing region.

The sealing member may be located in the non-display region and may surround the display region. The forming of the black matrix patterns may include forming a plurality of crossing black matrix patterns in the non-display region. The crossing black matrix patterns may cross the sealing region and may be successively arranged in the sealing region. The forming of the black matrix pattern may include forming a first black matrix pattern in the display region, and forming a second black matrix pattern in the non-display region. The first black matrix pattern in the display region and the second black matrix pattern in the non-display may be formed of different materials and compositions. Black matrix patterns in the display region and black matrix patterns in the non-display region may be successively formed of a same material. The forming the of black matrix patterns may include forming a first black matrix pattern in the display region. The first black matrix pattern may have a lattice shape including a plurality of openings corresponding to sub-pixels, and the plurality of openings of the first black matrix pattern may include color filters corresponding to the sub-pixels. The sealing member may be a frit. A pixel circuit and an organic light emitting diode (OLED) may be formed on the first substrate. A pixel circuit may be formed on the first substrate, and a liquid crystal layer may be formed between the first substrate and the second substrate.

BRIEF DESCRIPTION OF THE DRAWINGS

Features will become more apparent to those of ordinary skill in the art by describing in detail exemplary embodiments with reference to the attached drawings in which.

DETAILED DESCRIPTION

Korean Patent Application No. 10-2010-0103673, filed Oct. 22, 2010, in the Korean Intellectual Property Office, and entitled "Flat Display Panel, Mother Substrate For Flat Display Panel, and Method of Manufacturing the Flat Display Panel," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, the present invention will be described in detail by explaining exemplary embodiments with reference to the attached drawings.

Figure 1:
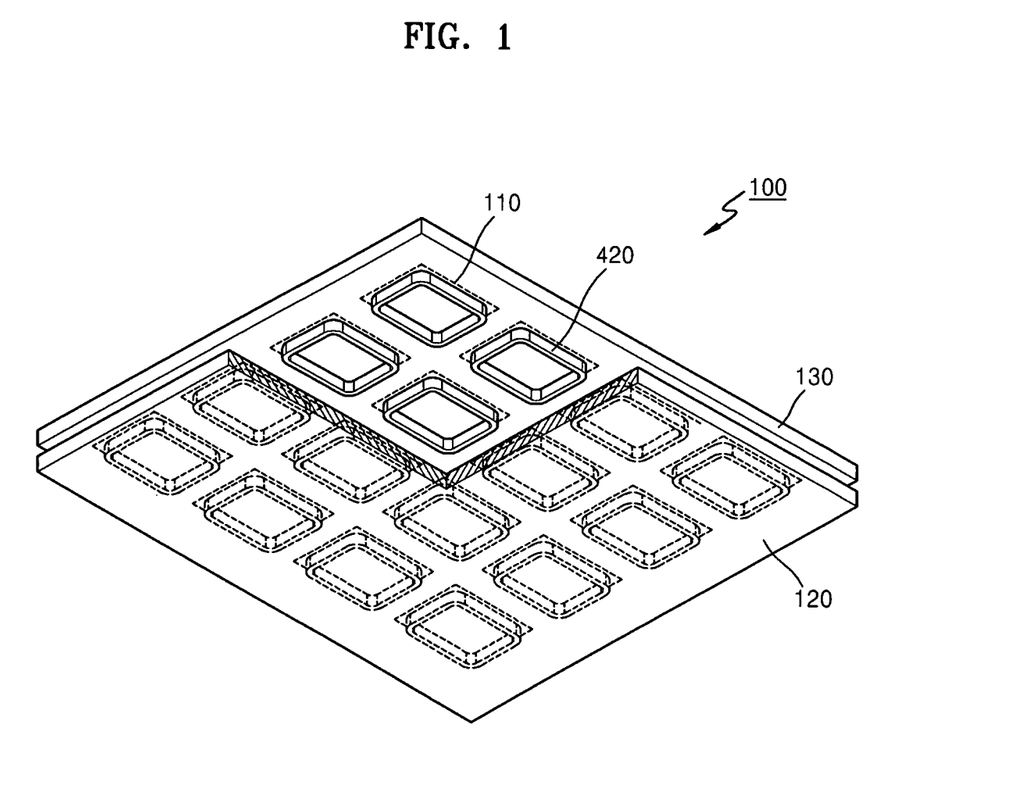
FIG. 1 illustrates a perspective view of a mother substrate for a flat display panel, according to an exemplary embodiment.

FIG. 1 illustrates a perspective view of a mother substrate 100 for a flat display panel, according to an exemplary embodiment.

Referring to FIG. 1, the mother substrate 100 includes a plurality of flat display panels 110, and each of the plurality of flat display panels 110 may be configured, such that a first substrate 120 and a second substrate 130 are sealed by a sealing member 420. Each of the plurality of flat display panels 110 may be acquired by forming the first substrate 120 and the second substrate 130, sealing the first substrate 120 and the second substrate 130 by using the sealing member 420, and dicing the mother substrate 100. Although the first substrate 120 is partially cut in FIG. 1 for convenience of explanation, the first substrate 120 may be formed to extend in parallel to the second substrate 130.

A pixel circuit, a driving circuit, and an electrode may be formed on the first substrate 120. If the flat display panel 110 is the flat display panel 110 for an organic electroluminescent display device, an organic light emitting diode (OLED) may be further formed on the first substrate 120. If the flat display panel 110 is the flat display panel 110 for a liquid crystal display (LCD) device, a liquid crystal layer may be interposed between the first substrate 120 and the second substrate 130. Furthermore, the first substrate 120 may be any of various $SiO_2$-based substrates, e.g., a crystalline silicon (LTPS) substrate. The second substrate 130 may be an encapsulation substrate, and the second substrate 130 may be a transparent substrate formed of, e.g., a glass material or a plastic material.

The sealing member 420 may be any of various types of sealing members, e.g., a frit.

Figure 2:
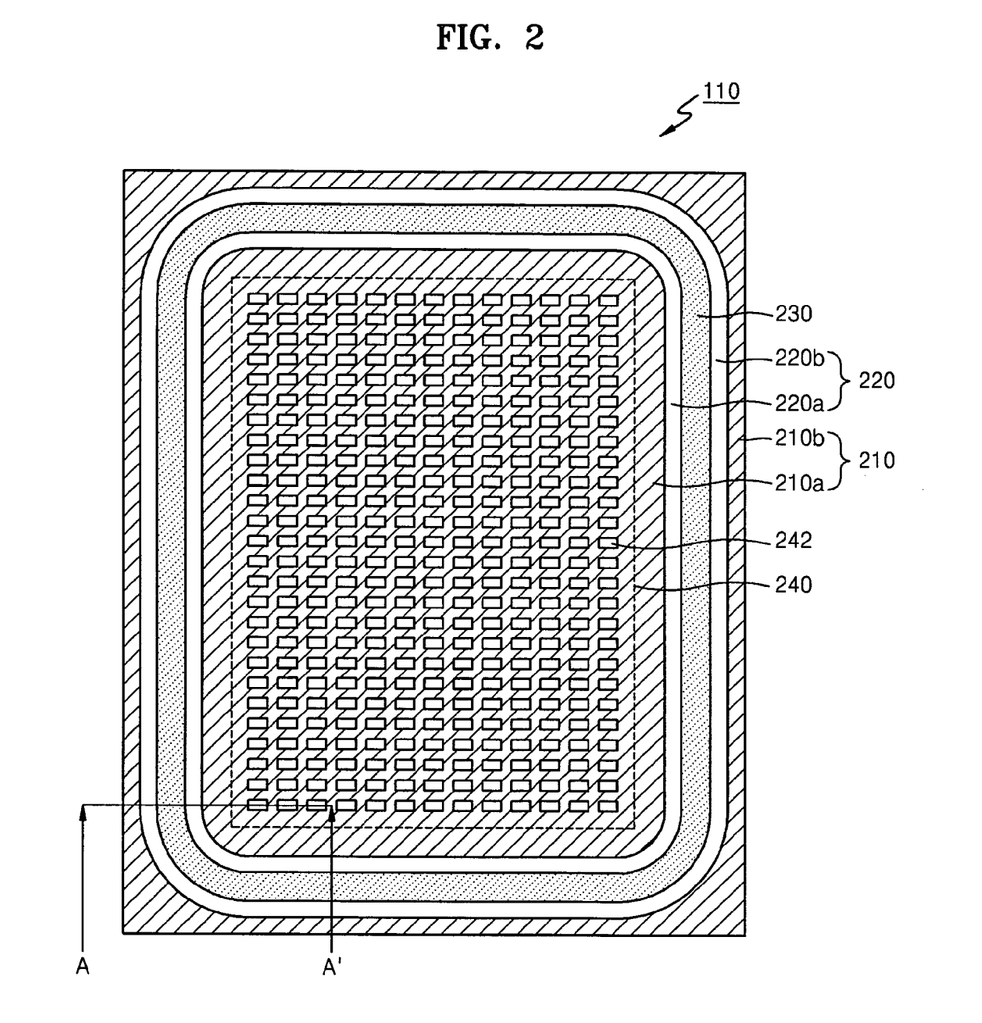
FIG. 2 illustrates a plan view of a flat display panel, according to an exemplary embodiment.

FIG. 2 illustrates a plan view of the flat display panel 110 according to an exemplary embodiment, viewed from the second substrate 130.

The second substrate 130 according to an exemplary embodiment may include a display region inside a guiding line 240 and a non-display region outside the guiding line 240. A plurality of sub-pixels 242 may be arranged in the display region. A sealing region 230 may be arranged in the non-display region outside the display region. The sealing region 230 may have arranged therein the sealing member 420. Black matrix patterns 210a and 210b may be formed in at least one of the display region and the non-display region of the flat display panel 110, e.g., of the non-display region of the second substrate 130. For example, the black matrix pattern 210b may be only in the non-display region, and the black matrix pattern 210a be in the display region and extend into the non-display region.

The black matrix patterns 210a and 210b may include at least one opening. The opening of the black matrix patterns 210a and 210b may be at least in a portion corresponding to the sealing region 230, e.g., the black matrix pattern 210b may surround the sealing region 230 along an outer edge of the non-display region and the black matrix pattern 210a may surrounding the sealing region 210 along an inner edge of the non-display region. The opening may be determined to minimize, reduce, and/or prevent a laser from being irradiated onto the display region, a device, an electrode, and/or a light emitting material when the laser is being irradiated onto the sealing member 420. The opening in the black matrix patterns 210a and 210b around the sealing region 230 may further extend by predetermined widths 220a and 220b outward from the sealing region 230.

The black matrix pattern in the display region, e.g., portions of black matrix pattern 210a, may be formed in a lattice shape, such that openings are formed in the black matrix pattern in regions corresponding to the sub-pixels 242. Furthermore, color filters may be formed in the regions corresponding to the sub-pixels 242 on the second substrate 130.

The black matrix patterns in the opening for the sealing region 230 may be formed in various forms according to exemplary embodiments. Hereinafter, exemplary embodiments will be described.

Figure 3:
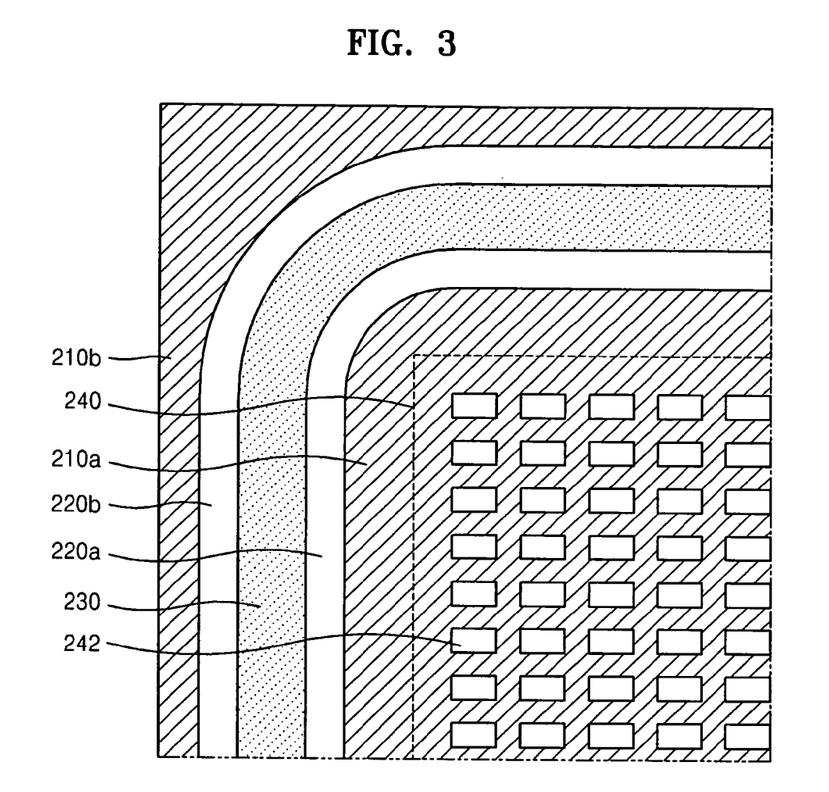
FIG. 3 illustrates a plan view of the flat display panel of FIG. 2, according to an exemplary embodiment.

FIG. 3 illustrates a plan view showing the upper-left portion of the flat display panel 110 of FIG. 2 according to an exemplary embodiment in closer detail.

As shown in FIG. 3, according to an exemplary embodiment, the opening for the sealing region 230 may be formed along the sealing region 230. The guiding line 240 may indicate a margin in which a black matrix pattern shall be formed to, e.g., minimize, reduce, and/or prevent deterioration of quality of displayed images due to light emission from a region other than, e.g., the display region or light leakage. According to an exemplary embodiment, the opening may be formed not to extend over the guiding line 240, such that the black matrix pattern 210a covers the guiding line 240. The black matrix pattern 210a outside the sealing region 230 may be successively formed inside and outside the guiding line 240, i.e., may overlap the guiding line 240 and areas inside and outside the guiding line 240.

Figure 4:
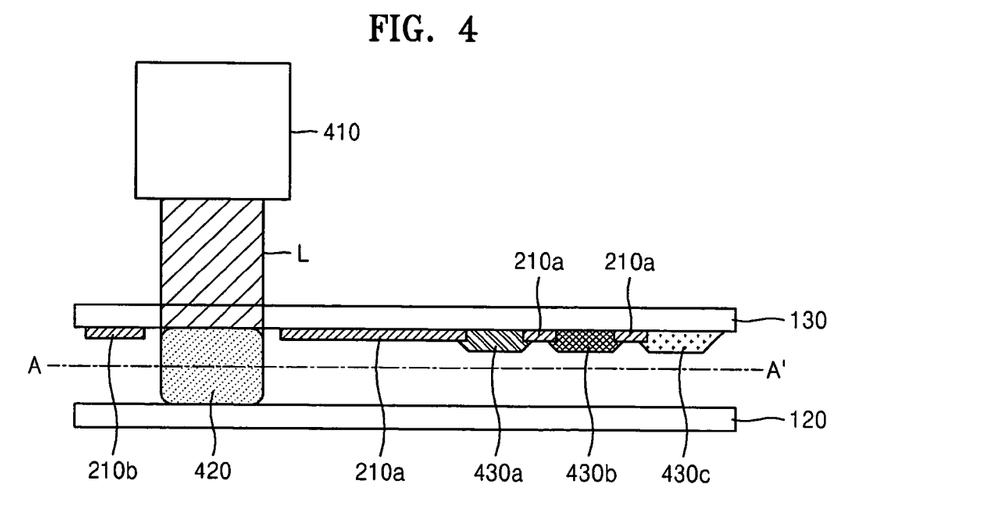
FIG. 4 illustrates a cross-sectional view taken along line A-A' of the flat display panel of FIG. 2, according to an exemplary embodiment.

FIG. 4 illustrates a cross-sectional view of the flat display panel 110 including the black matrix patterns 210a and 210b of FIG. 3, and taken along a line A-A' of FIG. 2, according to an exemplary embodiment.

According to an exemplary embodiment, as shown in FIG. 4, the first substrate 120 and the second substrate 130 may be sealed by using the sealing member 420. For example, to seal the flat display panel 110, the sealing member 420 may be applied onto the first substrate 120 before the second substrate 130 is arranged thereon. The sealing region 230 of the second substrate 130 may be arranged in correspondence to the region of the first substrate 120, to which the sealing member 420 is arranged and/or will be later arranged. The sealing member 420 may be melted by irradiating a laser beam L onto the sealing member 420, e.g., by using a laser emitting device 410, and the sealing member 420 may be hardened. Without intending to be bound by this theory, since an opening in the black matrix patterns 210a and 210b is formed in an area surrounding the sealing region 230, the black matrix patterns may act like a mask during irradiation of a laser beam L. Therefore, according to an exemplary embodiment, the laser beam L may be irradiated onto the sealing member 420 without using a separate mask.

Since the black matrix pattern according to an exemplary embodiment may act like a mask, the black matrix pattern may be formed of a material, which is not damaged by a laser. The black matrix pattern according to an exemplary embodiment may be formed of, e.g., a metal. For example, black matrix pattern according to an exemplary embodiment may include chrome (Cr) and/or a chrome oxide (CrOx).

Color filters 430a, 430b, and 430c may be formed in a plurality of openings corresponding to the sub-pixels 242 of the display region. Optical characteristics of each of the color filters 430a, 430b, and 430c may be determined according to arrangement of the sub-pixels 242.

Although FIG. 4 illustrates an example in which the black matrix patterns 210a and 210b of the display region and the non-display region are formed to have a same height, the black matrix patterns 210a and 210b may also be formed to have a step between the display region and the non-display region.

Figure 5:
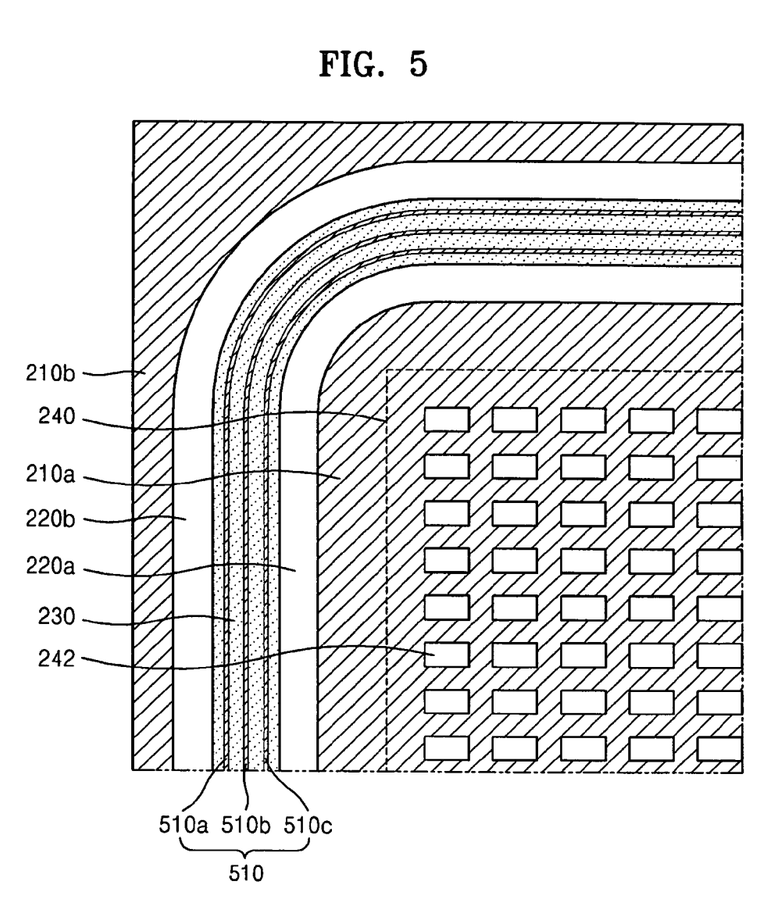
FIG. 5 illustrates a plan view of the flat display panel of FIG. 2, according to an exemplary embodiment.

FIG. 5 illustrates a plan view showing the upper-left portion of the flat display panel 110 of FIG. 2 according to an exemplary embodiment in closer detail.

According to an exemplary embodiment, a linear black matrix 510 may be arranged in the sealing region 230. The linear black matrix 510 may include linear black matrix patterns 510a, 510b, and 510c. The linear black matrix patterns 510a, 510b, and 510c may be formed to have linear shapes along the arrangement of the sealing member 420. The linear black matrix 510 may be formed on the second substrate 130.

Without intending to be bound by this theory, when a laser beam L is irradiated onto the sealing member 420, distribution of energy incident via the laser beam L may not be uniform throughout the sealing region 230, or the energy profile of the laser beam L may exceed an energy profile needed to melt the sealing member 420. Therefore, according to an exemplary embodiment, the energy profile of a laser beam L irradiated onto the sealing member 420 via the sealing region 230 may be adjusted by arranging the linear black matrix 510. Energy of a laser beam L irradiated onto the sealing region 230 may be incident to the sealing member 420 via a region, in which the linear black matrix pattern 510 is not arranged, may be conducted through the sealing member 420, and/or may be uniformly transmitted throughout the sealing member 420.

The linear black matrix pattern 510 may be formed of the same material as the black matrix patterns 210a and 210b in regions other than the sealing region 230 or may be formed of other materials. For example, materials and composition of the linear black matrix pattern 510 may be adjusted in consideration of properties, such as thermal transmission, to adjust the energy profile of a laser beam transmitted to the sealing member 420.

Furthermore, the line width of each linear black matrix pattern 510a, 510b, and 510c may be selected to adjust the energy profile of a laser beam transmitted to the sealing member 420. For example, the line width of the linear black matrix pattern 510 may be reduced to increase an amount of energy transmitted to the sealing member 420, or the line width of the linear black matrix pattern 510 may be increased to reduce the amount of energy transmitted to the sealing member 420.

A number of the linear black matrix patterns in the linear black matrix 510 is not limited to black matrix patterns 510a, 510b, and 510c. The number of black matrix patterns may be more than or less than 3. For example, the number of linear black matrix patterns may be varied to control the energy profile of a laser beam transmitted to the sealing member 420.

Figure 6:
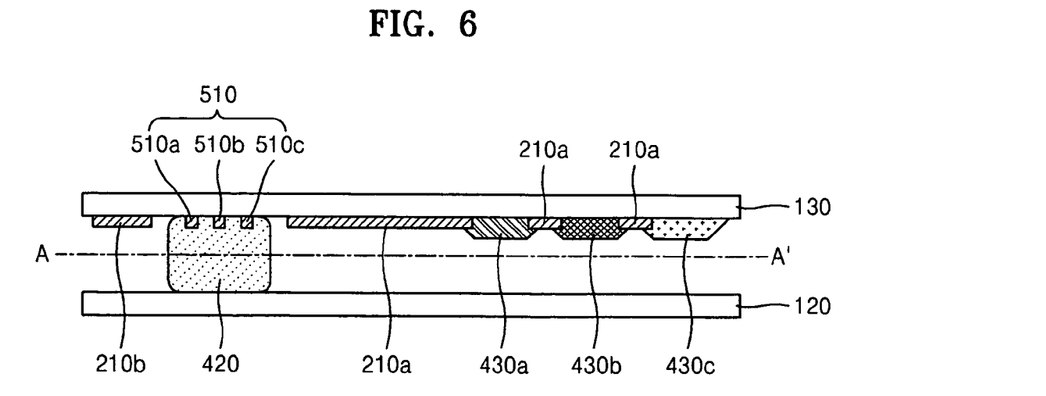
FIG. 6 illustrates a cross-sectional view taken along line A-A' of the flat display panel of FIG. 2, according to an exemplary embodiment.

FIG. 6 illustrates a sectional view of the flat display panel 110 including the linear black matrix patterns 510a, 510b, and 510c of FIG. 5, and taken along a line A-A' of FIG. 2, according to an exemplary embodiment.

As shown in FIG. 6, at least one of the linear black matrix patterns 510a, 510b, and 510c may be arranged in the sealing region 230, e.g., of the first substrate 130. The linear black matrix patterns 510a, 510b, and 510c may be formed to have a same height as the black matrix patterns 210a and 210b in regions other than the area surrounding the sealing region 230 or may be formed to have a different height from the black matrix patterns 210a and 210b. The linear black matrix patterns 510a, 510b, and 510c may be in contact with the sealing member 420 when the first substrate 120 and the second substrate 130 are combined.

Figure 7:
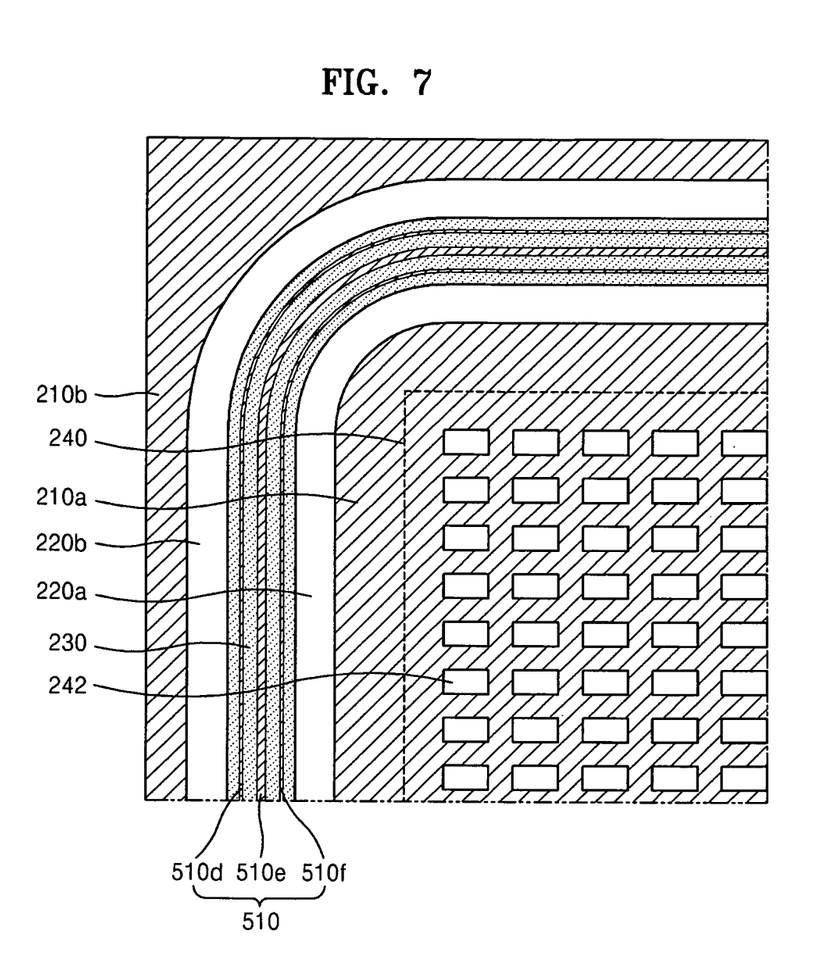
FIG. 7 illustrates a plan view of the flat display panel of FIG. 2, according to an exemplary embodiment.

FIG. 7 illustrates a plan view showing the upper-left portion of the flat display panel 110 of FIG. 2 according to an exemplary embodiment in closer detail.

According to the present embodiment, the linear black matrix 510 may include at least one of linear black matrix patterns 510d, 510e, and 510f arranged in the sealing region 230 of the second substrate 130. The linear black matrix patterns 510d, 510e, and 510f may have different line widths. The line widths of the linear black matrix patterns 510d, 510e, and 510f may be measured in a direction defining the opening between the black matrix patterns 210a and 210b. For example, the line width of the linear black matrix pattern 501e, which is located relatively close to the center of the sealing region 230, may be greater than the line widths of the linear black matrix patterns 510d and 510f, which are located relatively further away from the center of the sealing region 230. Without intending to be bound by this theory, it is likely that the energy distribution of a laser beam L is highest at the center of the laser beam L, and the laser beam L may be focused on the center of the sealing region 230. Therefore, for uniform energy transmission throughout the sealing region 230, the linear black matrix pattern 510e relatively closer to the center of the sealing region 230 may formed to have a line width greater than the line widths of the other linear black matrix patterns 510d and 510f.

Figure 8:
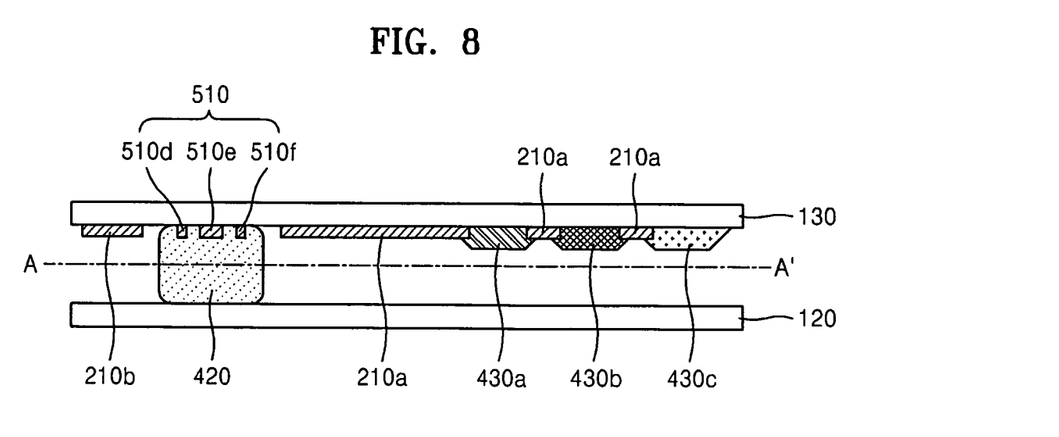
FIG. 8 illustrates a cross-sectional view taken along line A-A' of the flat display panel of FIG. 2, according to an exemplary embodiment.

FIG. 8 illustrates a sectional view of the flat display panel 110 including the linear black matrix patterns 510d, 510e, and 510f, and taken along a line A-A' of FIG. 2, according to the present embodiment.

As shown in FIG. 8, the line width w1 of the linear black matrix pattern 510e, which is located relatively close to the center of the sealing region 230, may be greater than the width w2 of the linear black matrix patterns 510d and 510f, which are located relatively further away from the center of the sealing region 230.

According to an exemplary embodiment, the line widths of linear black matrix patterns, e.g., linear black matrix patterns 510d, 510e, and 510f, may increase with respect to the center of the sealing region 230, such that, e.g., the linear black matrix patterns have increasing line widths in a direction toward the center of the sealing region. For example, if five linear black matrix patterns are arranged, the linear black matrix pattern closest to the center of the sealing region 230 has the greatest line width, and line widths of the other linear black matrix patterns may decrease as distances to the center of the sealing region 230 increases. Alternatively, from among the black matrix patterns 510d, 510e, and 510f, the linear black matrix pattern closest to the center of the sealing region 230 may have the greatest line width, and the remaining linear black matrix patterns may have a same line width. For example, if five linear black matrix patterns are arranged, the linear black matrix pattern closest to the center of the sealing region 230 may have the greatest line width, and the remaining four linear black matrix patterns may have a same line width, which is smaller than the line width of the linear black matrix pattern closest to the center of the sealing region 230.

The at least one linear black matrix patterns 510d, 510e, and 510f may be formed of same material and composition, or may be formed of different materials and compositions. The linear black matrix pattern 510 including at least one of linear black matrix patterns 510d, 510e, and 510f, may be formed of the same material as the black matrix patterns 210a and 210b or may be formed of other materials. For example, materials and composition of the linear black matrix pattern 510 may be adjusted in consideration of properties, such as thermal transmission, to adjust the energy profile of a laser beam transmitted to the sealing member 420.

Figure 9:
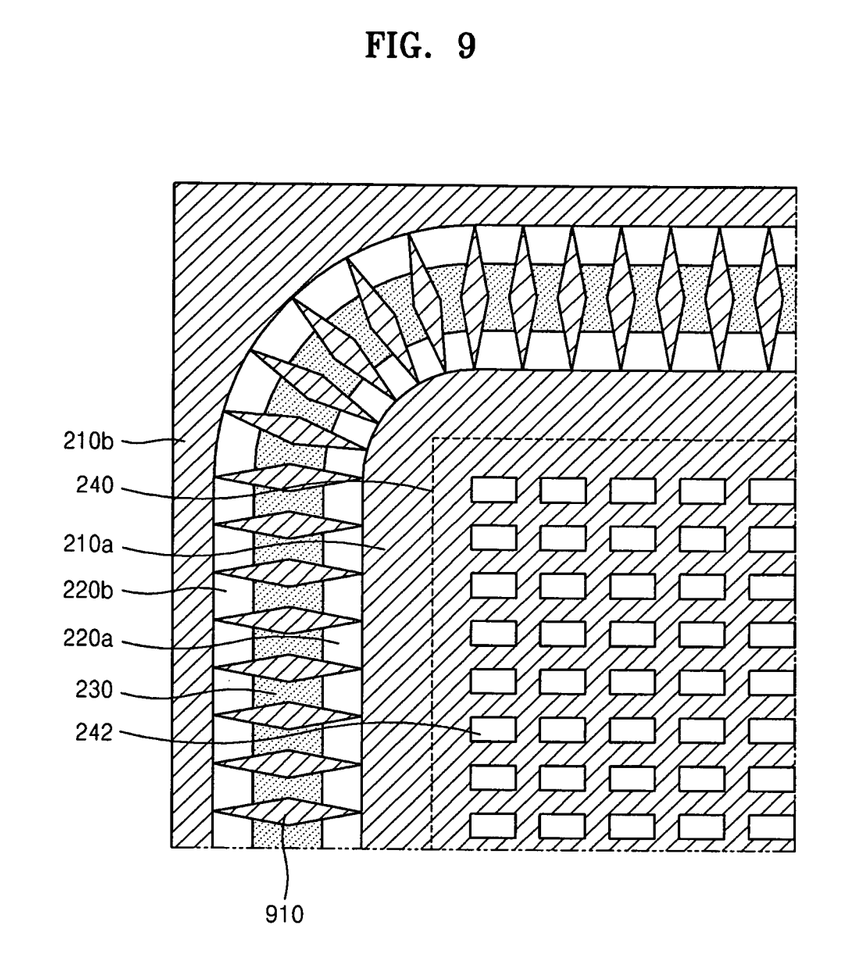
FIG. 9 illustrates a plan view of the flat display panel of FIG. 2, according to an exemplary embodiment.

FIG. 9 illustrates a plan view showing the upper-left portion of the flat display panel 110 of FIG. 2, according to an exemplary embodiment in closer detail.

According to the present embodiment, as shown in FIG. 9, at least one crossing black matrix pattern 910 may be formed across the sealing region 230. The crossing black matrix patterns 910 may be repetitively arranged across the sealing region 230, e.g., as shown in FIG. 9. A line width of each crossing black matrix pattern 910 and an interval between the crossing black matrix patterns 910 may be determined, such that the energy profile of an incident laser beam is suitably adjusted. The crossing black matrix patterns 910 may extend across, e.g., across the entire width of, the opening between the black matrix patterns 210a and 210b. Each crossing black matrix pattern 910 may extend over the sealing region 230 and the predetermined widths 220a and 220b.

Although FIG. 9 illustrates that the crossing black matrix patterns 910 as having a rhombus-like shape, the crossing black matrix patterns 910 may have any of various shapes. The crossing black matrix patterns 910 may have one shape or difference shapes. Exemplary shapes include, but are not limited to, a rectangular shape, an elliptical shape, or the like. Without intending to be bound by this theory, since it is likely that the energy distribution of a laser beam L is highest at the center of the laser beam L, and the laser beam L may be focused on the center of the sealing region 230, for uniform energy transmission throughout the sealing region 230, the crossing black matrix patterns 910 may be formed, such that line widths of the crossing linear black matrix patterns decrease as distances to the center of the sealing region 230 increase.

The crossing black matrix patterns 910 may be formed of same material and composition, or may be formed of different materials and compositions. The crossing black matrix patterns 910, which may include portions extending over the sealing region 230, may be formed of the same material as the black matrix patterns 210a and 210b or may be formed of other materials. For example, materials and composition of the crossing black matrix patterns 910 may be adjusted in consideration of properties, such as thermal transmission, to adjust the energy profile of a laser beam transmitted to the sealing member 420.

Figure 10:
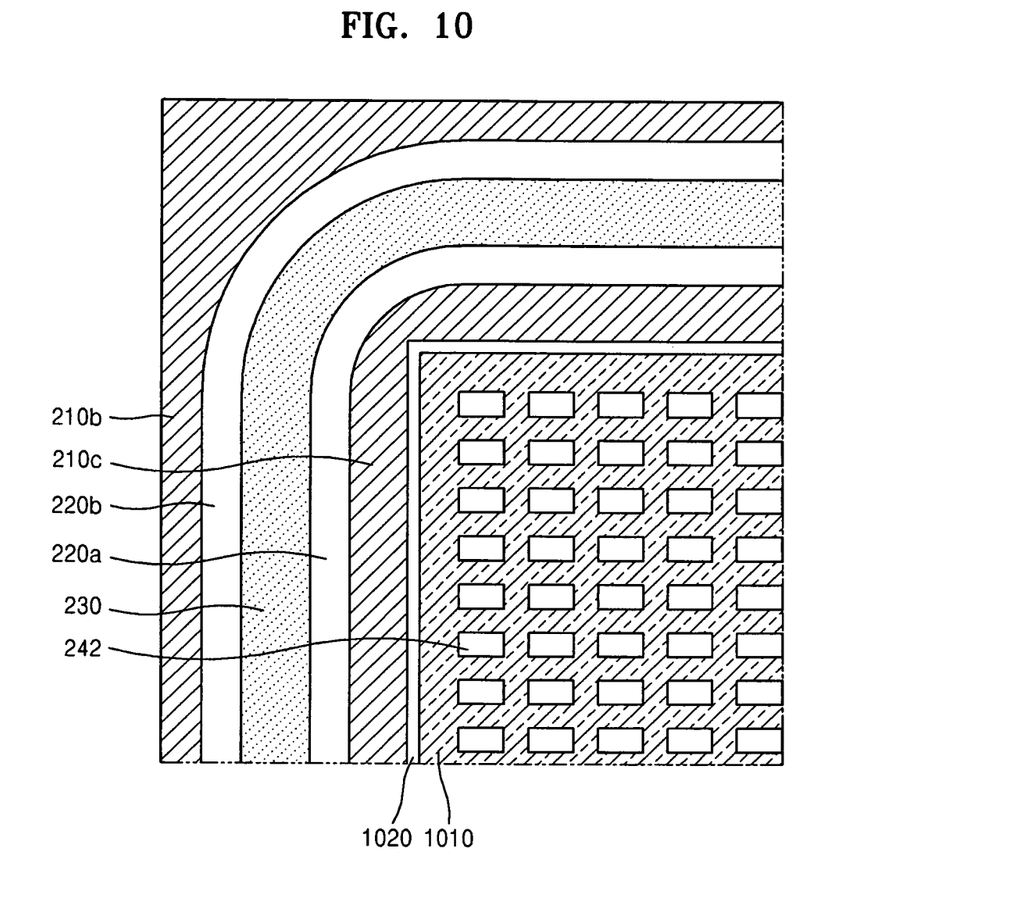
FIG. 10 illustrates a plan view of the flat display panel of FIG. 2, according to an exemplary embodiment.

FIG. 10 illustrates a plan view showing the upper-left portion of the flat display panel 110 of FIG. 2, according to an exemplary embodiment in closer detail.

According to the present embodiment, a black matrix pattern 1010 in the display region and the black matrix regions 210b and 210c in the non-display region may be formed of different materials and compositions. For example, the black matrix pattern 1010 in the display region may be formed of an organic material, such as a resin. The black matrix patterns 210b and 210c in the non-display region may be formed of a different material than the black matrix pattern 1010, e.g., may be formed of a metal. A size of the black matrix pattern 1010 in the display region may be determined in consideration of a margin for, e.g., reducing, minimizing, and/or preventing light leakage from a flat panel display device including the flat display panel 100 according to exemplary embodiments. For example, the size of the black matrix pattern 1010 may be same as or larger than that of the region marked with the guiding line 240 in FIG. 2.

In the present embodiment, black matrix pattern 1010 in the display region and the black matrix regions 210b and 210c in the non-display region may be formed of different materials and compositions, in consideration of different functions of the black matrix patterns 1010, 210b, and 210c.

Furthermore, according to the present embodiment, the black matrix pattern 1010 in the display region and the black matrix pattern 210c in the non-display region may have a predetermined gap 1020 between the borders thereof. The width and the location of the gap 1020 between the black matrix pattern 1010 in the display region and the black matrix pattern 210c in the non-display region may be determined, such that the black matrix pattern 1010 in the display region may minimize, reduce, and/or prevent light leakage and the black matrix patterns 210b and 210c may act as a mask during irradiation of a laser beam L.

Figure 11:
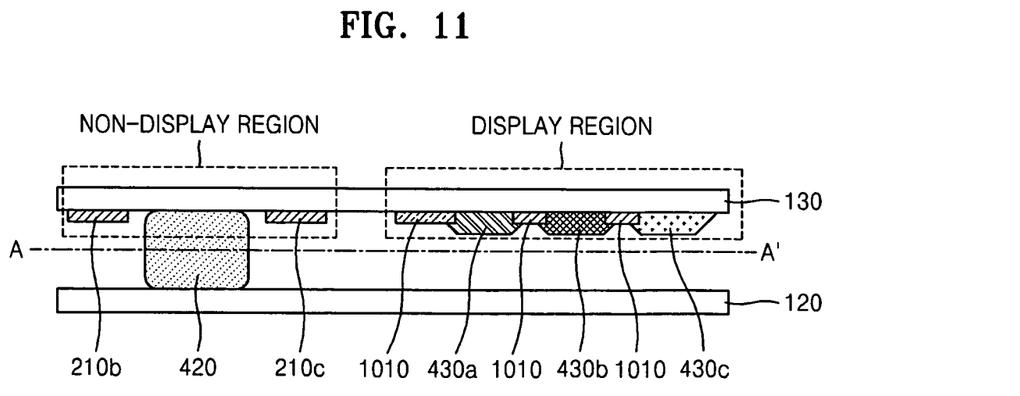
FIG. 11 illustrates a cross-section view taken along line A-A' of the flat display panel of FIG. 2, according to an exemplary embodiment.

FIG. 11 illustrates a sectional view of the flat display panel 110 including black matrix patterns 210b, 210c, and 1010, and taken along a line A-A' of FIG. 2, according to an exemplary embodiment.

According to the present embodiment, as shown in FIG. 11, the black matrix pattern 1010 in the display region and the black matrix patterns 210b and 210c in the non-display region may be formed of different materials and compositions. The black matrix pattern 1010 in the display region and the black matrix regions 210b and 210c in the non-display region may have a same height or may have different heights.

Figure 12:
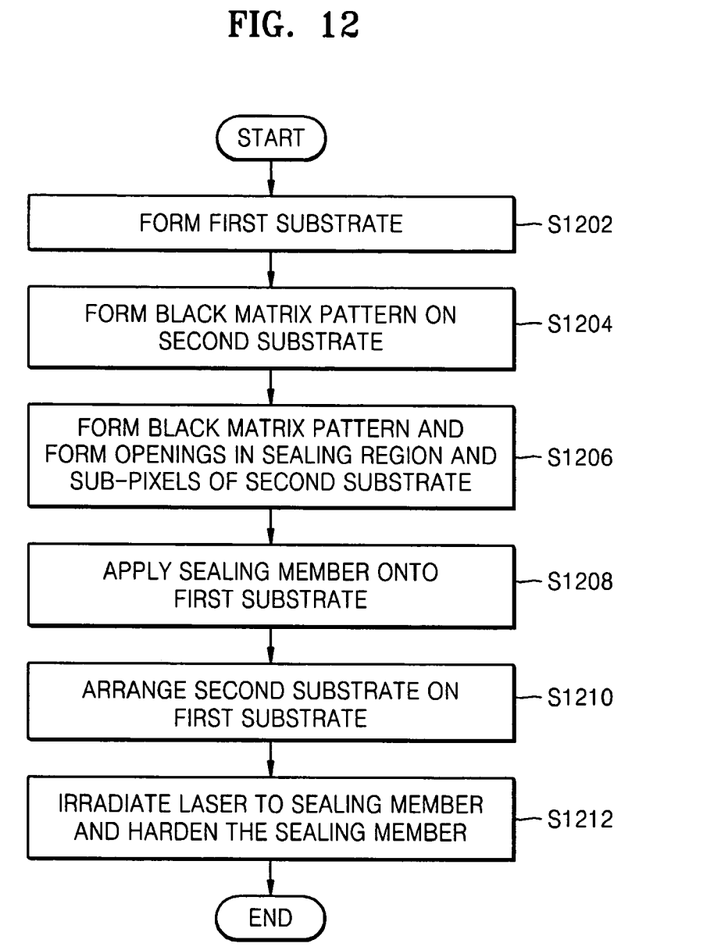
FIG. 12 illustrates a flowchart of an exemplary method of fabricating a flat display panel.

FIG. 12 illustrates a flowchart showing a method of fabricating a flat display panel according to an exemplary embodiment.

A first substrate may be formed in operation S1202. The first substrate 120 may include at least one of a driving circuit, a pixel circuit, and an electrode formed thereon. A black matrix pattern layer may be formed on the second substrate 130 in an operation S1204. After the black matrix pattern layer is formed on the second substrate 130, a black matrix pattern may be formed by etching the black matrix pattern layer to form openings in the sealing region 230 and the sub-pixel region 242 of the second substrate 130, in an operation S1206. A shape of the black matrix pattern and a material for forming the black matrix pattern may differ according to embodiments. For example, the black matrix pattern may include variously shapes, including but not limited to, black matrix patterns in the display and non-display regions, linear black matrix patterns, and/or crossing black matrix patterns. Furthermore, a sequence of performing the formation of the first substrate 120, e.g., the operation S1202, and the formation of the second substrate 130, e.g., the operation S1204, is not limited to the sequence as shown in FIG. 12. For example, the first substrate 120 and the second substrate 130 may be formed in any order. Furthermore, operations for interposing a liquid crystal layer and an organic layer between the first substrate 120 and the second substrate 130 may be performed.

Next, the sealing member 420 may be applied onto the first substrate 120, in an operation S1208. In an operation S1210, the second substrate 130 may be arranged on the first substrate 120, such that the sealing member 420 is located in the sealing region 230 of the second substrate 230. Next, the first substrate 120 and the second substrate 130 may be sealed by melting and hardening the sealing member 420, e.g., by irradiating a laser beam L to the sealing member 420 via the sealing region 230 on the second substrate 130, in an operation S1212.

Exemplary embodiments have been disclosed herein, and although specific terms are employed, they are used and are to be interpreted in a generic and descriptive sense only and not for purpose of limitation. Accordingly, it will be understood by those skilled in the art that various changes in form and details may be made therein without departing from the spirit and scope of the invention as defined by the appended claims. The exemplary embodiments should be considered in descriptive sense only and not for purposes of limitation.

What is claimed is:

1. A flat display panel, comprising:
   a first substrate and a second substrate, the first and second substrates being sealed via a sealing member therebetween, wherein:
   the second substrate includes a display region and a non-display region, the display region and the non-display region including black matrix patterns; and
   the black matrix patterns have at least one opening in a sealing region of the non-display region, the sealing member being arranged in the sealing region,
   the sealing member is arranged in the non-display region and surrounds the display region, and
   at least one black matrix pattern in the non-display region includes a plurality of linear black matrix patterns in the sealing region, the plurality of linear black matrix patterns having a linear shape along the sealing member and being arranged parallel to each other.

2. The flat display panel as claimed in claim 1, wherein widths of the plurality of linear black matrix patterns increase for corresponding linear black matrix patterns located closer to a center of the sealing region.

3. The flat display panel as claimed in claim 1, wherein black matrix patterns in the display region and black matrix regions in the non-display region include different materials and compositions.

4. The flat display panel as claimed in claim 1, wherein black matrix patterns in the display region and black matrix regions in the non-display region are successively arranged and include a same material.

5. The flat display panel as claimed in claim 1, wherein black matrix patterns in the non-display region protect a laser beam from being irradiated toward regions outside the sealing region when the laser beam is irradiated toward the sealing member.

6. The flat display panel as claimed in claim 1, wherein at least one black matrix pattern in the display region has a lattice shape including a plurality of openings corresponding to sub-pixels, the second substrate including color filters formed in the plurality of openings corresponding to sub-pixels.

7. The flat display panel as claimed in claim 1, wherein the sealing member is a frit.

8. The flat display panel as claimed in claim 1, wherein the first substrate includes a pixel circuit and an organic light emitting diode (OLED).

9. The flat display panel as claimed in claim 1, wherein:
   the first substrate includes a pixel circuit, and
   a liquid crystal layer is interposed between the first substrate and the second substrate.

10. A mother substrate, comprising a plurality of the flat display panels as claimed in claim 1.

11. A method of fabricating a flat display panel, the flat display panel including a first substrate and a second substrate, the method comprising:
   forming black matrix patterns in a display region and a non-display region of the second substrate, the black matrix patterns having at least one opening in a sealing region of the non-display region;
   arranging the second substrate in parallel to the first substrate, such that a sealing member is located in the sealing region of the second substrate and between the first and second substrates, the sealing member being configured to seal the first substrate and the second substrate; and
   sealing the first substrate and the second substrate by irradiating a laser beam to the sealing member through the at least one opening in the black matrix patterns in the sealing region of the non-display region, wherein:
   the sealing member is located in the non-display region and surrounds the display region; and the forming of the black matrix patterns includes forming a plurality of linear black matrix patterns in the sealing region, the plurality of linear black matrix patterns having a linear shape along the sealing member.

12. The method as claimed in claim 11, wherein the plurality of linear black matrix patterns are formed such that widths of the plurality of linear black matrix patterns increase for corresponding linear black matrix patterns located closer to a center of the sealing region.

13. The method as claimed in claim 11, wherein the forming of the black matrix patterns includes:
 forming a first black matrix pattern in the display region; and
 forming a second black matrix pattern in the non-display region, the first black matrix pattern in the display region and the second black matrix pattern in the non-display being formed of different materials and compositions.

14. The method as claimed in claim 11, wherein black matrix patterns in the display region and black matrix patterns in the non-display region are successively formed of a same material.

15. The method as claimed in claim 11, wherein the forming of the black matrix patterns includes forming a first black matrix pattern in the display region, the first black matrix pattern having a lattice shape including a plurality of openings corresponding to sub-pixels, the plurality of openings of the first black matrix pattern including color filters corresponding to the sub-pixels.

16. The method as claimed in claim 11, wherein the sealing member is a frit.

17. The method as claimed in claim 11, further comprising forming a pixel circuit and an organic light emitting diode (OLED) on the first substrate.

18. The method as claimed in claim 11, further comprising:
 forming a pixel circuit on the first substrate; and
 forming a liquid crystal layer between the first substrate and the second substrate.

19. A flat display panel, comprising:
 a first substrate and a second substrate, the first and second substrates being sealed via a sealing member therebetween, wherein:
 the second substrate includes a display region and a non-display region, the display region and the non-display region including black matrix patterns; and
 the black matrix patterns have at least one opening in a sealing region of the non-display region, the sealing member being arranged in the sealing region, wherein:
 the sealing member is arranged in the non-display region and surrounds the display region, and
 the black matrix pattern in the non-display region includes a plurality of crossing black matrix.

20. A method of fabricating a flat display panel, the flat display panel including a first substrate and a second substrate, the method comprising:
 forming black matrix patterns in a display region and a non-display region of the second substrate, the black matrix patterns having at least one opening in a sealing region of the non-display region;
 arranging the second substrate in parallel to the first substrate, such that a sealing member is located in the sealing region of the second substrate and between the first and second substrates, the sealing member being configured to seal the first substrate and the second substrate; and
 sealing the first substrate and the second substrate by irradiating a laser beam to the sealing member through the at least one opening in the black matrix patterns in the sealing region of the non-display region, wherein:
 the sealing member is located in the non-display region and surrounds the display region; and
 the forming of the black matrix patterns includes forming a plurality of crossing black matrix patterns in the non-display region, the crossing black matrix patterns crossing the sealing region and being successively arranged in the sealing region.

* * * * *